United States Patent [19]

Fukada

[11] Patent Number: 5,753,564

[45] Date of Patent: May 19, 1998

[54] METHOD FOR FORMING A THIN FILM OF A SILICON OXIDE ON A SILICON SUBSTRATE, BY BCR PLASMA

[75] Inventor: Takashi Fukada, Nishinomiya, Japan

[73] Assignee: Sumitomo Metal Industries, Ltd., Osaki, Japan

[21] Appl. No.: 486,260

[22] Filed: Jun. 7, 1995

Related U.S. Application Data

[63] Continuation-in-part of Ser. No. 155,804, Nov. 23, 1993, abandoned.

[30] Foreign Application Priority Data

Nov. 24, 1992 [JP] Japan .................. 4-313720
Mar. 25, 1993 [JP] Japan .................. 5-067116

[51] Int. Cl.$^6$ ........................... H01L 21/02
[52] U.S. Cl. .............. 437/238; 438/288; 438/783; 427/571; 427/579
[58] Field of Search .................. 437/238, 240; 438/283, 788, 789, 624; 427/571, 579

[56] References Cited

U.S. PATENT DOCUMENTS

| | | | |
|---|---|---|---|
| 4,894,352 | 1/1990 | Lane et al. ............... | 437/238 |
| 5,124,014 | 6/1992 | Foo et al. ................ | 204/192.32 |
| 5,204,288 | 4/1993 | Marks et al. ............ | 437/228 |
| 5,215,787 | 6/1993 | Homma ................... | 427/248.1 |
| 5,219,783 | 6/1993 | Moslehi ................... | 437/57 |
| 5,252,515 | 10/1993 | Tsai et al. ............... | 437/195 |
| 5,273,936 | 12/1993 | Ikeda ...................... | 437/180 |
| 5,279,865 | 1/1994 | Chebi et al. ............ | 427/574 |
| 5,334,552 | 8/1994 | Homma ................... | 437/195 |

FOREIGN PATENT DOCUMENTS

| | | |
|---|---|---|
| 0 496 543 A2 | 7/1992 | European Pat. Off. . |
| 0 517 548 A2 | 12/1992 | European Pat. Off. . |
| 60-144940 | 7/1985 | Japan . |
| 61-284578 | 12/1986 | Japan . |
| 62-293619 | 12/1987 | Japan ............ H01L 21/205 |
| 3-36762 | 2/1991 | Japan . |
| 3-36767 | 2/1991 | Japan ............ H01L 29/784 |
| 4-239750 | 8/1992 | Japan . |
| 5-226480 | 4/1993 | Japan . |
| 5-90249 | 4/1993 | Japan . |
| 92/20833 | 11/1992 | WIPO . |

OTHER PUBLICATIONS

Fukuda et al "Preparation of SiO$_2$ Films with Low Deposited Dielectric Constant by ECR Plasma CVD" Mar. 29, 1993.

Extended Abstracts (The 40th Spring Meeting, 1993); The Japan Society of Applied Physics and Related Societies, pp. 752.

Fukuda et al, "Preparation of SiO$_2$ Films with Low Deposited Dielectric Constant by ECR Plasma CVD", Extended, Sep. 27, 1993.

Abstracts (The 54th Autumn Meeting, 1993); The Japan Society of Applied Physics, pp. 692.

Preparation of SiOF Films with Low Dielectric Constant by ECR Plasma Chemical Vapor Deposition, ssdm '93, The Japan Society of Applied Physics, Imternational Conference on Solid State Devices and Materials, Aug. 29–Sep. 1, 1993, Chiba, Japan, pp. 158–160.

Nonaka et al, "Photochemical Vapor Deposition of Amorphous Silica Films Using Disilane and Perfluorosilanes: Defect Structures and Deposition Mechanism" J. Appl. Phys. 64(8), 15 Oct. 1988.

"Preparation of SiOF Films with Low Dielectric Constant by ECR Plasma Chemical Vapor Deposition" Takashi Fukada and Takashi Akahori, Research and Development Division, Sumitomo Metal Industries, Ltd. 30 Aug. 1993.

*Primary Examiner*—Charles L. Bowers, Jr.
*Assistant Examiner*—Mat Whipple
*Attorney, Agent, or Firm*—Armstrong, Westerman, Hattori, McLeland, & Naughton

[57] ABSTRACT

A method for forming a thin film of a silicon oxide on a silicon substrate is disclosed. An Si oxide film is formed by an ECR plasma. CVD with the use of a silicon compound gas containing fluorine, whereby the generation of particles can be suppressed to improve the quality of the device and the yield, the planarity of the Si oxide film functioning as an interlayer dielectric film or a passivation film can be improved, and the higher speed operation in a semiconductor device can be accomplished.

3 Claims, 19 Drawing Sheets

METHOD FOR FORMING A THIN FILM OF A SILICON OXIDE ON A SILICON SUBSTRATE, BY BCR PLASMA

BACKGROUND OF THE INVENTION

This application is a continuation-in-part of application Ser. No. 08/155,804 filed Nov. 23, 1993, now abandoned.

1. Field of the Invention

The invention relates to a method for forming a thin film of silicon oxide on a silicon substrate.

2. Description of the Related Art

Insulating films used in an LSI or a VLSI include a capacitor insulating film, an interlayer dielectric film, and a passivation film. Among these insulating films, the interlayer dielectric film is often formed by a plasma CVD with the use of $SiH_4$, $O_2$ or $N_2O$ because a plasma CVD hardly develops defects such as pinholes, or cracks in an insulating film.

However, the reactivity of $SiH_4$ with $O_2$ or $N_2O$ is so high that, when they are merely mixed with each other, $SiH_4$ explosively reacts with $O_2$ or $N_2O$. When activated by a plasma, $SiH_4$ reacts with $O_2$ or $N_2O$ further easily. When an Si oxide film is formed by a plasma CVD, therefore, a phenomenon, that a reactant is deposited on portions other than a semiconductor, for example, on an inner wall of a chamber on which an Si oxide film is formed, takes place. This deposit causes particles to be generated, thereby producing a problem in that a resultant semiconductor device is degraded in quality. In order to prevent particles from being generated, it is required to frequently clean the inside of the chamber. This causes another problem in that the working ratio of the system is impaired so that the production yield of semiconductor devices is lowered.

In order to solve these problems, a method has been proposed in which an Si oxide film is formed with the use of a silicon fluoride gas having a reactivity less than that of $SiH_4$ (J. Appl. Phys. 64(8), 15 Oct. 1988). In the proposed method, a film is grown by a photo CVD using $Si_2F_6$, $O_2$ and $Si_2H_6$ as source gasses. The reactivities of these gasses are slightly lower, and the amount of a reactant deposited on an inner wall of a chamber is reduced. Since the film growth cannot be accomplished with the use of only $Si_2F_6$ and $O_2$, however, it is required to use also $Si_2H_6$ which is highly reactive. Also in the proposed method, therefore, there is the problem that a strong reaction occurs.

When an interlayer dielectric film is to be formed, the planarizability plays an important role. In the case where an interlayer dielectric film is formed so as to cover fine patterns of a line gap of 0.5 μm or less, a void is produced, or a defect such as a space is produced, such that a portion between adjacent lines is covered with an insulating film deposited on edges of the lines and the insulating film does not fill the portion between the lines sufficiently. This produces a problem in that the planarizability is impaired.

Recently, with the object of increasing the operation speed of a semiconductor device, particularly, an LSI, it is requested to use an Si oxide film having a lower dielectric constant as an interlayer dielectric film for an Al line and a passivation film, so that the time constant of the signal transmission through an Al line is reduced. In a conventional oxide film CVD such as a photo CVD, a thermal CVD, or a plasma CVD which uses, for example, $SiH_4$ and $O_2$, $SiH_4$ and $N_2O$, or TEOS, $O_3$ and $O_2$, a resulting Si oxide film has a dielectric constant of 3.8 or higher. This high dielectric constant is a main cause of impeding the increase of the operation speed of an LSI. It is considered a phenomenon that the OH content in an Si oxide film is high is originated in the high dielectric constant.

An Si oxide film containing fluorine which is formed by a thermal CVD with the use of a source gas containing alkoxyfluorosilane as the main component is proposed (Japanese Patent Application Laid-Open Hei. 4-239750 (1992)). The Si oxide film has a dielectric constant of 3.7 which is a mere decrease of less than 10% from the value of the prior art. The value of the dielectric constant changes depending on the film growth temperature. Since the film contains OH, there arises a problem in that the reliability is low in the case where it is used as an interlayer dielectric film.

A method of forming a gate insulating film of an insulated gate type field effect transistor by a plasma (CVD with the use of a gas of a monosilane derivative containing chlorine such as dichlorosilane ($SiH_2Cl_2$) or a gas of a monosilane derivative containing fluorine is proposed (Japanese Patent Application Laid-Open Hei. 3-36767 (1991)). This proposal is directed to the improvement of the breakdown strength and the reduction of the interface state density in the formation of an Si oxide film on polysilicon which are problems in a conventional thermal oxidation and a CVD. In the proposed method, the proportion of the monosilane derivative gas containing an element such as chlorine or fluorine or that of hydrogen chloride is increased when the film is to be grown, so that the film growth is conducted while removing from a silicon layer contaminants such as a native oxide file, organic substances and metals. The publication does not mention an Si oxide film containing fluorine.

On the contrary, the publication states that, when a gas of a monosilane derivative such as dichlorosilane or a mixture of hydrogen chloride and monosilane is used, the quantity of chlorine or fluorine contained in the film is reduced by increasing the proportion of the monosilane gas, thereby forming an oxide film which has a high breakdown strength and which is excellent in quality. The publication suggests that the film containing chlorine or fluorine is not preferable.

SUMMARY OF THE INVENTION

The invention has been devised in order to solve the above-mentioned problems. It is an object of the invention to provide a semiconductor device and a method of producing the semiconductor device in which an Si oxide film is formed by a plasma CVD with the use of a silicon compound gas containing fluorine, whereby particles can be prevented from being generated so that the quality of the produced device and the yield thereof are improved, the planarity of the Si oxide film functioning as an interlayer dielectric film or a passivation film can be improved, and the higher speed operation in a semiconductor device can be accomplished.

According to the invention, in a semiconductor device and a method of producing the same, an Si oxide film containing 0.1 to 20 atom.% of fluorine or an Si oxide film having a dielectric constant of 3.7 to 2.9 is formed by a plasma CVD with the use of a silicon compound gas which contains fluorine, and $O_2$ or $N_2O$. Therefore, the Si oxide film is deposited on a substrate under a reaction milder than that of the prior art. Accordingly, the reaction does not proceed in a portion other than the plasma generating portion, so that the reactant adhesion to the wall of a production apparatus is reduced in degree and the generation of particles is reduced. The thus deposited Si oxide film has a very small content of OH or no OH, contains 0.1 to 20 atom.% of fluorine, and has a dielectric constant of 3.7 to 2.9. Therefore, the signal transmission in the semiconductor device can be conducted at a high speed. When the signal transmission speed of the semiconductor device is set to be the same level as that of the prior art, the thickness of the Si oxide film can be made thinner. Since a fluorine species generated in a plasma easily migrate, the covering property with respect to concave portions of the surface of a substrate is improved.

A method of producing a semiconductor device according to the invention comprises a step of depositing an Si oxide film which does not contain fluorine on a substrate including a material which is reactive with fluorine, with the use of $SiH_4$ and $O_2$ or $N_2O$ by a plasma CVD, and a step of depositing an Si oxide film containing fluorine on the Si oxide film which does not contain fluorine with the use of a silicon compound gas which contains fluorine, and $O_2$ or $N_2O$. Another method according to the invention comprises a step of depositing an Si oxide film containing fluorine with the use of a silicon compound gas which contains fluorine, and $O_2$ or $N_2O$, and a step of depositing an Si oxide film which does not contain fluorine on the Si oxide film containing fluorine with the use of $SiH_4$ and $O_2$ or $N_2O$. Therefore, a material which is reactive with fluorine, aluminum lines for example, can be prevented by the Si oxide film which does not contain fluorine from being corroded by fluorine.

Further, a plasma CVD with the use of a silicon compound gas which contains fluorine, and $O_2$ or $N_2O$ is conducted while applying a negative potential to a substrate. Accordingly, the film is deposited while concave and convex portions of the surface of the substrate undergo sputter etching, and hence an Si oxide film having a low dielectric constant is deposited so as to reduce the step between the convex and concave portions, or with excellent planarity.

The above and further objects and features of the invention will more fully be apparent from the following detailed description with accompanying drawings.

DESCRIPTION OF THE PREFERRED EMBODIMENTS

Hereinafter, the invention will be described with reference to the drawings illustrating the embodiments thereof.

Figure 1:
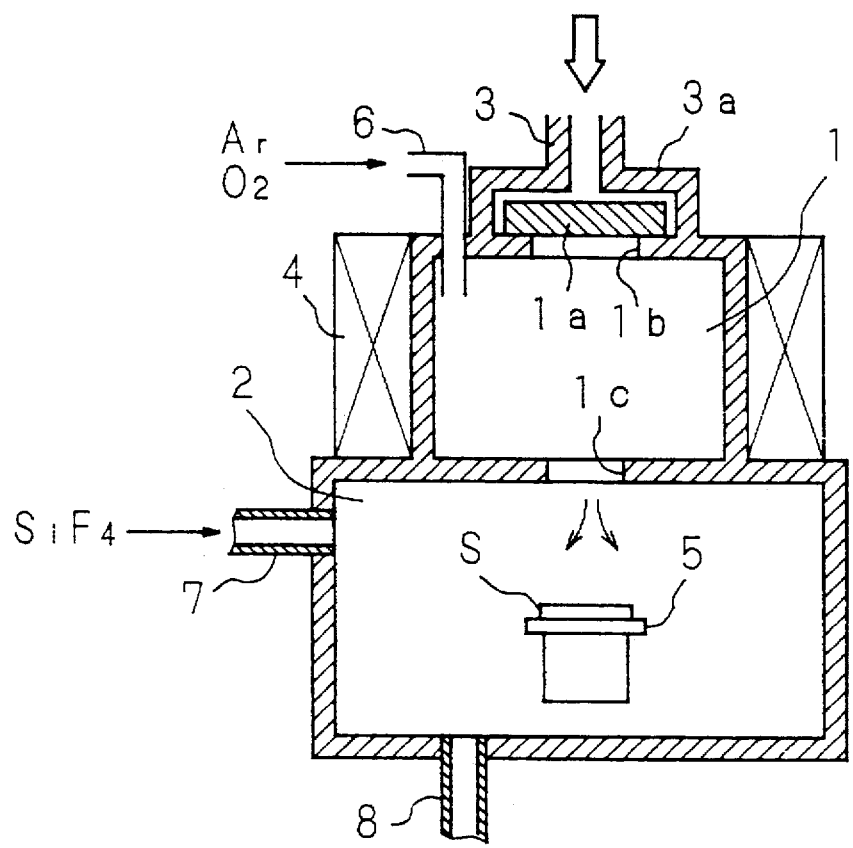
FIG. 1 is a schematic longitudinal section view showing the configuration of an ECR plasma CVD system which is used in a first embodiment of the invention.

FIG. 1 is a schematic longitudinal section view showing the configuration of an ECR plasma CVD apparatus which is used in an execution of the invention. In the figure, numeral 1 designates a plasma chamber which has a hollow cylindrical shape. A microwave inlet 1b having a circular shape is formed at the upper center portion of the chamber. A cylindrical waveguide 3 is connected at one end to a microwave oscillator which is not shown. The other end of the waveguide 3 is provided with a flange 3a, and connected to the microwave inlet 1b. A microwave introduction window 1a consisting of a quartz glass plate is formed in the microwave inlet 1b so as to close the microwave inlet 1b. In the periphery of the plasma chamber 1, an exciting coil 4 is disposed in such a manner that it concentrically surrounds the plasma chamber 1 and the other end portion of the waveguide 3 connected to the chamber. The exciting coil 4 is connected to a DC power source which is not shown. A gas feeding system 6 opens on the upper wall of the plasma chamber 1.

A plasma extraction window 1c is formed in the center portion of the lower wall of the plasma chamber 1 so as to oppose the microwave inlet 1b. In a reaction chamber 2 a specimen table 5 is located at a position which faces the plasma extraction window 1c. A specimen S is mounted on the wafer stage 5. In the reaction chamber 2, a gas feeding system 7 opens on the side wall, arid an exhaust system 8 on the lower wall. The exhaust system 8 is connected to an evacuation apparatus which is not shown.

In the apparatus having the above-described configuration, an Si oxide film can be formed on the specimen S in the following manner: At first, the wafer stage 5 is heated to a temperature of 300° C., and the plasma chamber 1 and the reaction chamber 2 are evacuated to a pressure of less than $1 \times 10^{-6}$ Torr through the exhaust system 8. Then, 30 sccm of $SiF_4$ is supplied from the gas feeding system 7 into the reaction chamber 2, and 43 sccm of Ar and 70 sccm of $O_2$ are supplied from the gas feeding system 6 into the plasma chamber 1. Thereafter, the inside of the reaction chamber 2 is set to a predetermined pressure, for example, $2\times10^{-3}$ Torr. A microwave of an output of 2.8 kW is introduced from the microwave oscillator which is not shown into the plasma chamber 1 through the waveguide 3 and the microwave introduction window 1a, and a magnetic field is generated in the plasma chamber 1 by the exciting coil 4, thereby satisfying the ECR conditions in the plasma chamber 1. Therefore, the Ar and $O_2$ gasses supplied into the plasma chamber 1 are decomposed and a plasma is generated. The generated plasma is introduced into the reaction chamber 2 by the magnetic field, and activates the $SiF_4$ gas so that an Si oxide film is formed on the surface of the specimen S.

Figure 2:
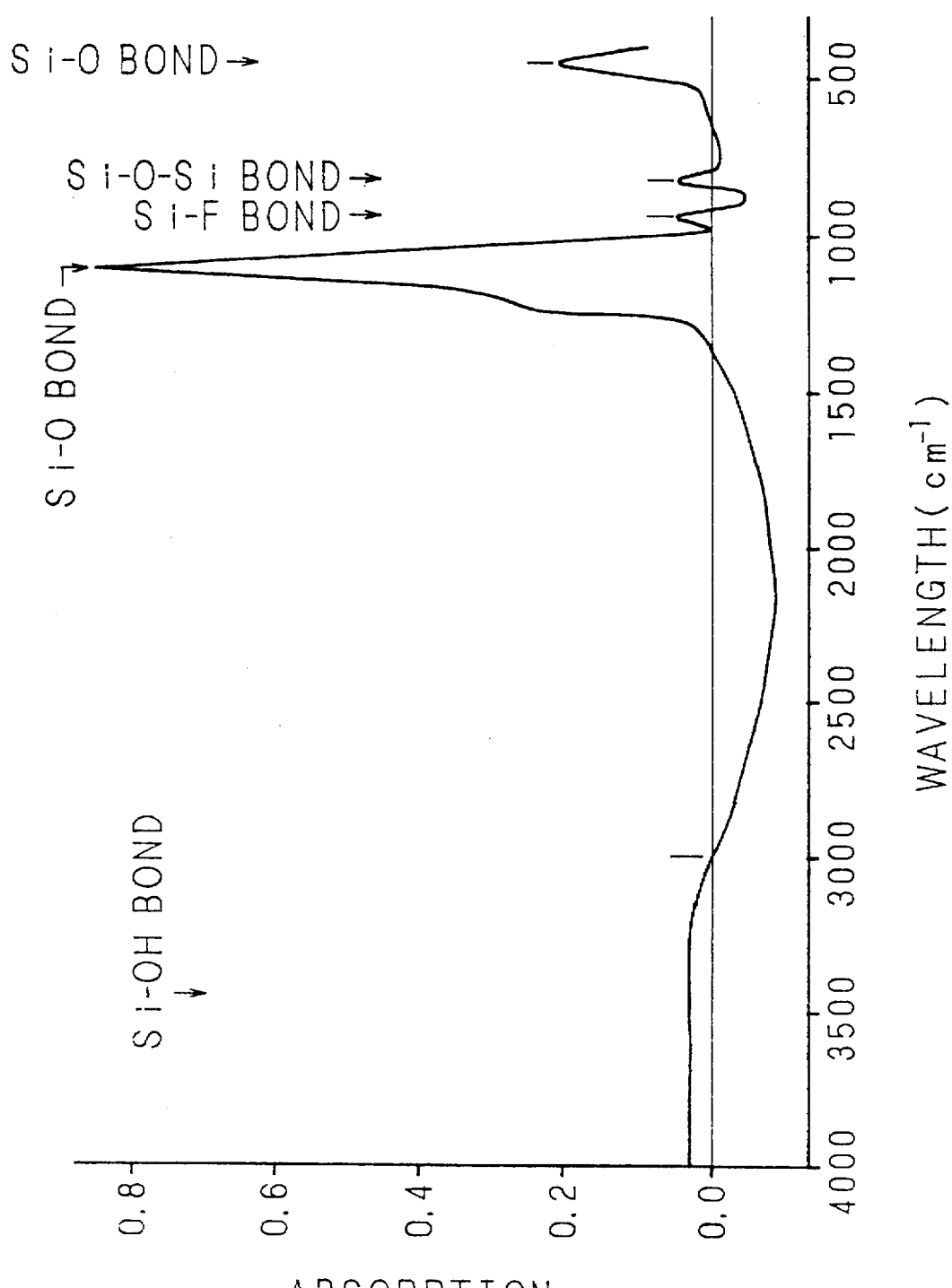
FIG. 2 shows the infrared absorption spectrum of an Si oxide film according to the first embodiment.

Next, a semiconductor device of a first embodiment which is produced by the aforementioned production method will be described. FIG. 2 shows the infrared absorption spectrum of the above-mentioned Si oxide film. As seen from the figure, an absorption due to the Si—F bond appears at 940 $cm^{-1}$, showing that fluorine is taken in the Si oxide film. It has been known that, in an Si oxide film formed by a conventional CVD, an absorption due to the Si—OH bond appears in the vicinity of 3,600 $cm^{-1}$. By contrast, in the Si oxide film according to the aforementioned embodiment, no absorption due to the Si—OH bond appears, showing that there is no OH in the Si oxide film.

Figure 3:
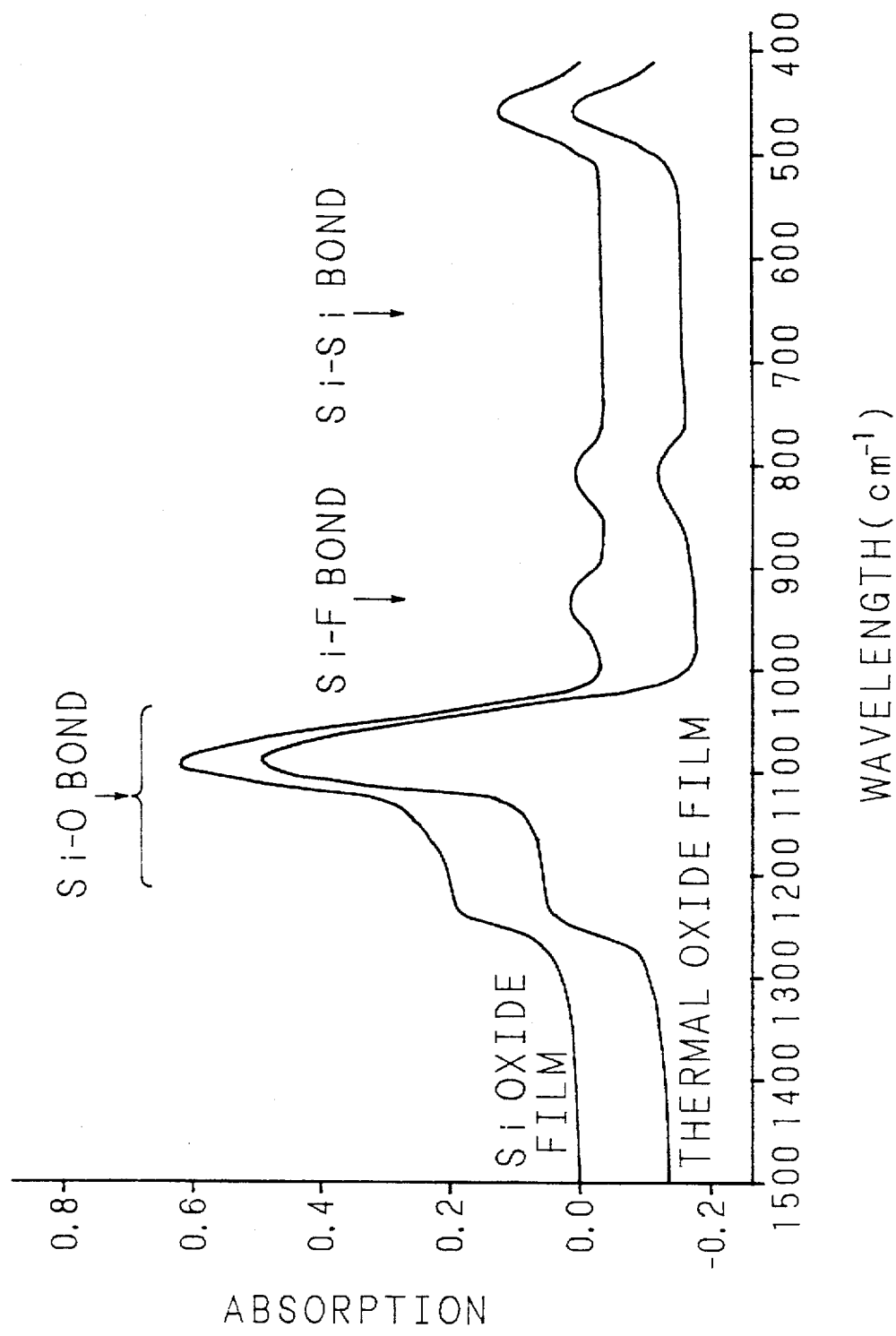
FIG. 3 shows the infrared absorption spectrum of an Si oxide film according to the first embodiment.

FIG. 3 shows the infrared absorption spectrum of the Si oxide film in the range of 400 $cm^{-1}$ to 1,500 $cm^{-1}$. In the figure, also an infrared absorption spectrum of a thermal oxide film is shown as a reference. The shape of the absorption spectrum due to the Si—O bond of the Si oxide film which appears in 1,000 $cm^{-1}$ to 1,300 $cm^{-1}$ is very similar to that of the thermal oxide film. This shows that, in the same manner as the thermal oxide film, the Si oxide film has stable Si—O bonds and an excellent film quality.

Figure 4:
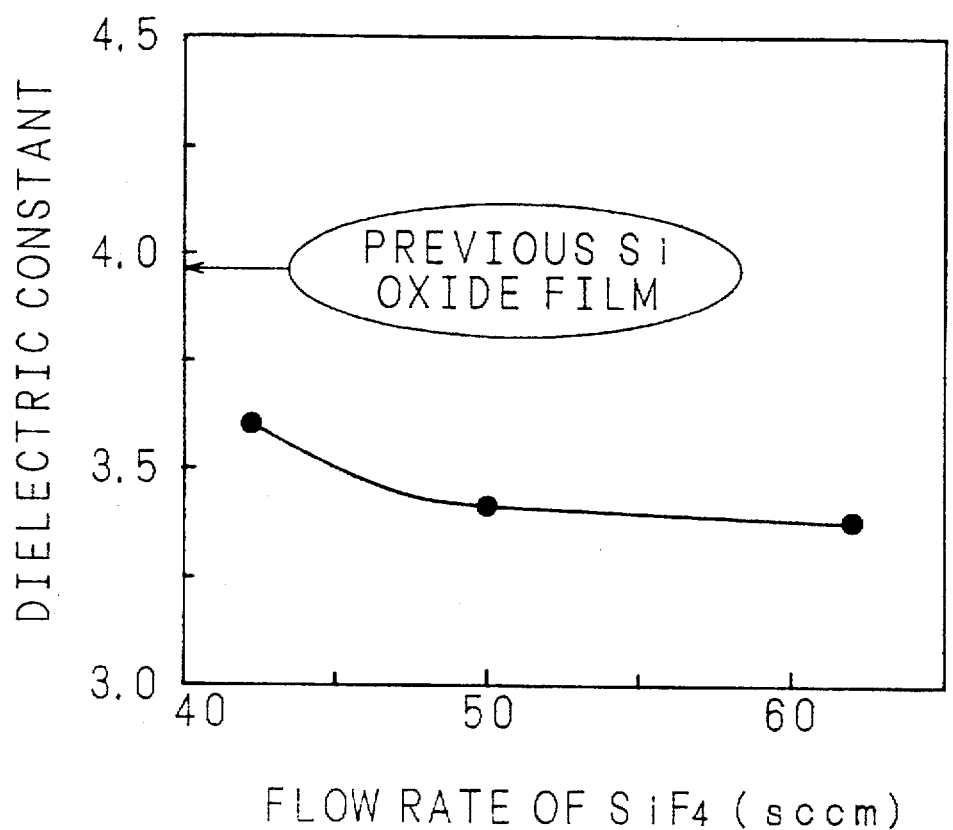
FIG. 4 is a graph showing the $SiF_4$ flow rate dependence of the dielectric constant of an Si oxide film according to the first embodiment.

FIG. 4 is a graph showing the $SiF_4$ dependence of the dielectric constant of the Si oxide film which is produced by the method described above. In the graph, the axis of ordinate indicates the dielectric constant, and the axis of abscissa indicates the flow rate of $SiF_4$. It has been known that, in an Si oxide film which is formed by a CVD with the use of $SiH_4$ and $O_2$, the lower limit of the dielectric constant is 3.8 to 3.9. As seen from the graph, according to the embodiment, a dielectric constant of 3.3 to 3.6 is realized, or an Si oxide film having a low dielectric constant can be obtained.

Figure 5:
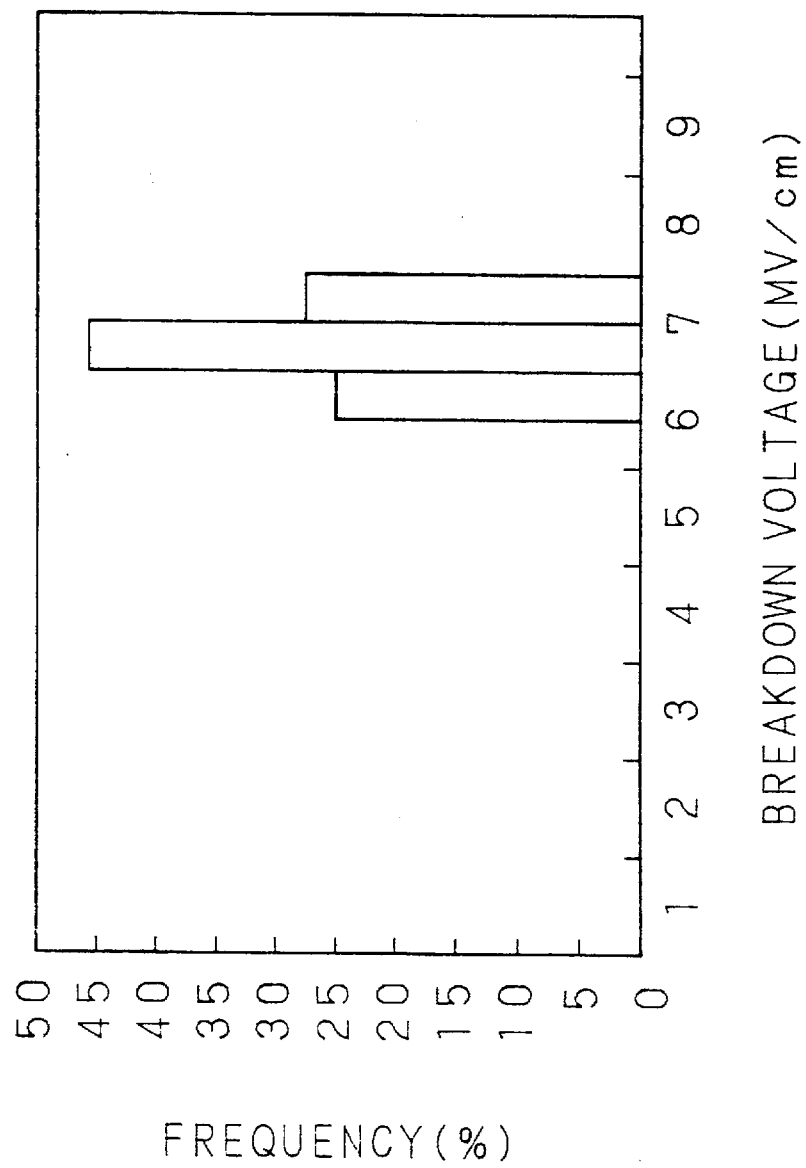
FIG. 5 is a graph showing the breakdown strength of an Si oxide film according to the first embodiment.

FIG. 5 is a graph showing the breakdown strength of the Si oxide film which is produced by the method described above. In the graph, the axis of abscissa indicates the breakdown voltage, and the axis of ordinate indicates the frequency. As seen from the graph, the breakdown voltage is distributed in the range of about 6.5 to 8.0 MV/cm. In other words, it can be said that the Si oxide film has excellent breakdown strength in the same manner as a conventional Si oxide film.

Figure 6:
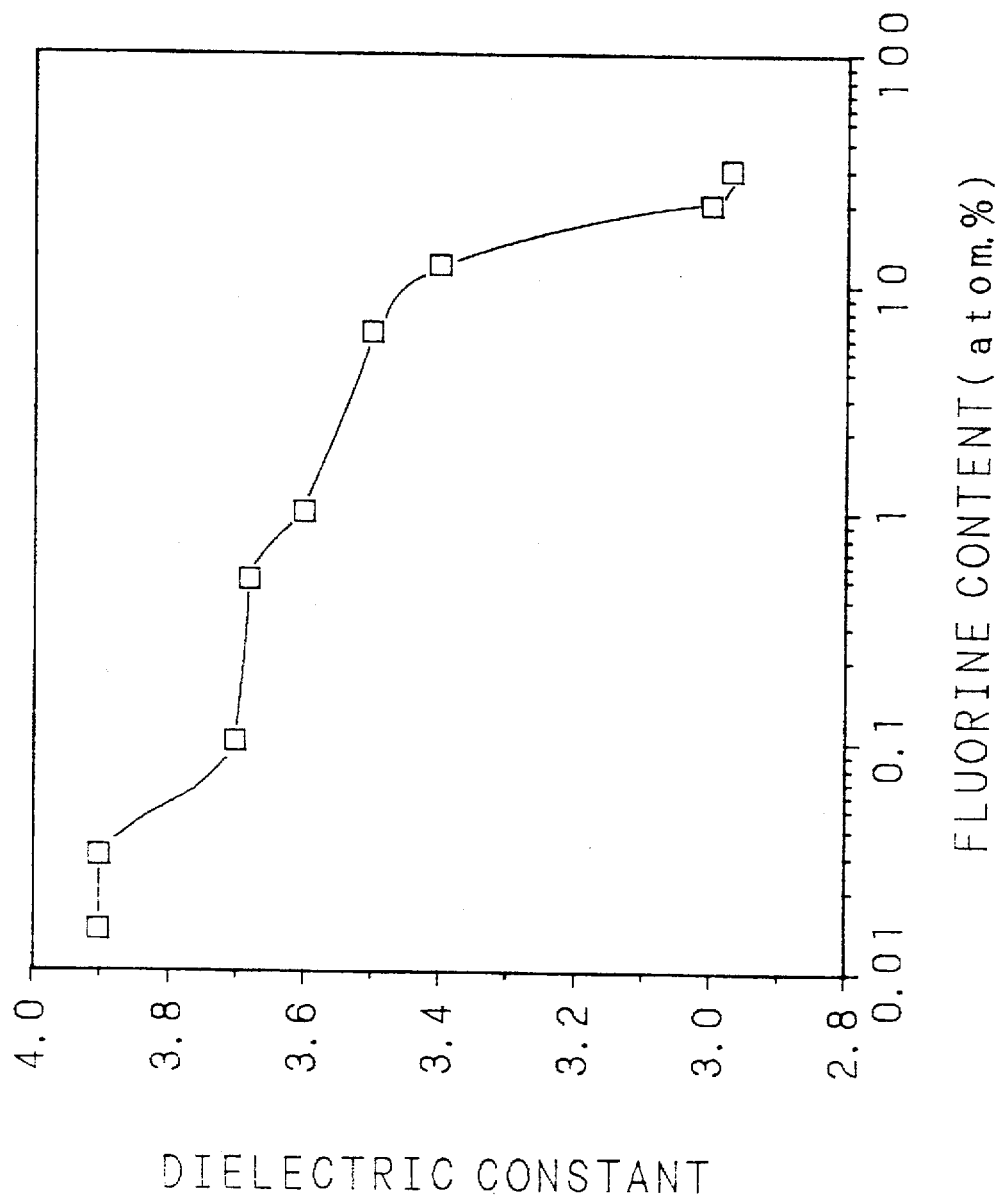
FIG. 6 is a graph showing the dielectric constant with respect to the quantity of fluorine in an Si oxide film according to a second embodiment.

Next, an Si oxide film according to a second embodiment which is produced by a production method under conditions different from those of the embodiment described above will be described. A specimen S was placed in the reaction chamber 2 of the apparatus (FIG. 1) used in the embodiment described above, and, under the conditions where the microwave power and the $O_2$ flow rate were optimized, an Si oxide film was formed on the specimen S. FIG. 6 is a graph showing the dielectric constant with respect to the quantity of fluorine in the Si oxide film. In the graph, the axis of ordinate indicates the dielectric constant, and the axis of abscissa indicates the fluorine content. As the fluorine content changes from 0.01 atom.% to 0.1 atom.%, the dielectric constant decreases from 3.9 to 3.7, and, as the fluorine content further changes from 0.1 atom.% to 20 atom.%, the dielectric constant decreases from 3.7 to 2.9. It is impossible to distinguish an Si oxide film having the fluorine content of less than 0.1 atom.% from an Si oxide film produced by the prior art, on the basis of their characteristics.

Figure 7:
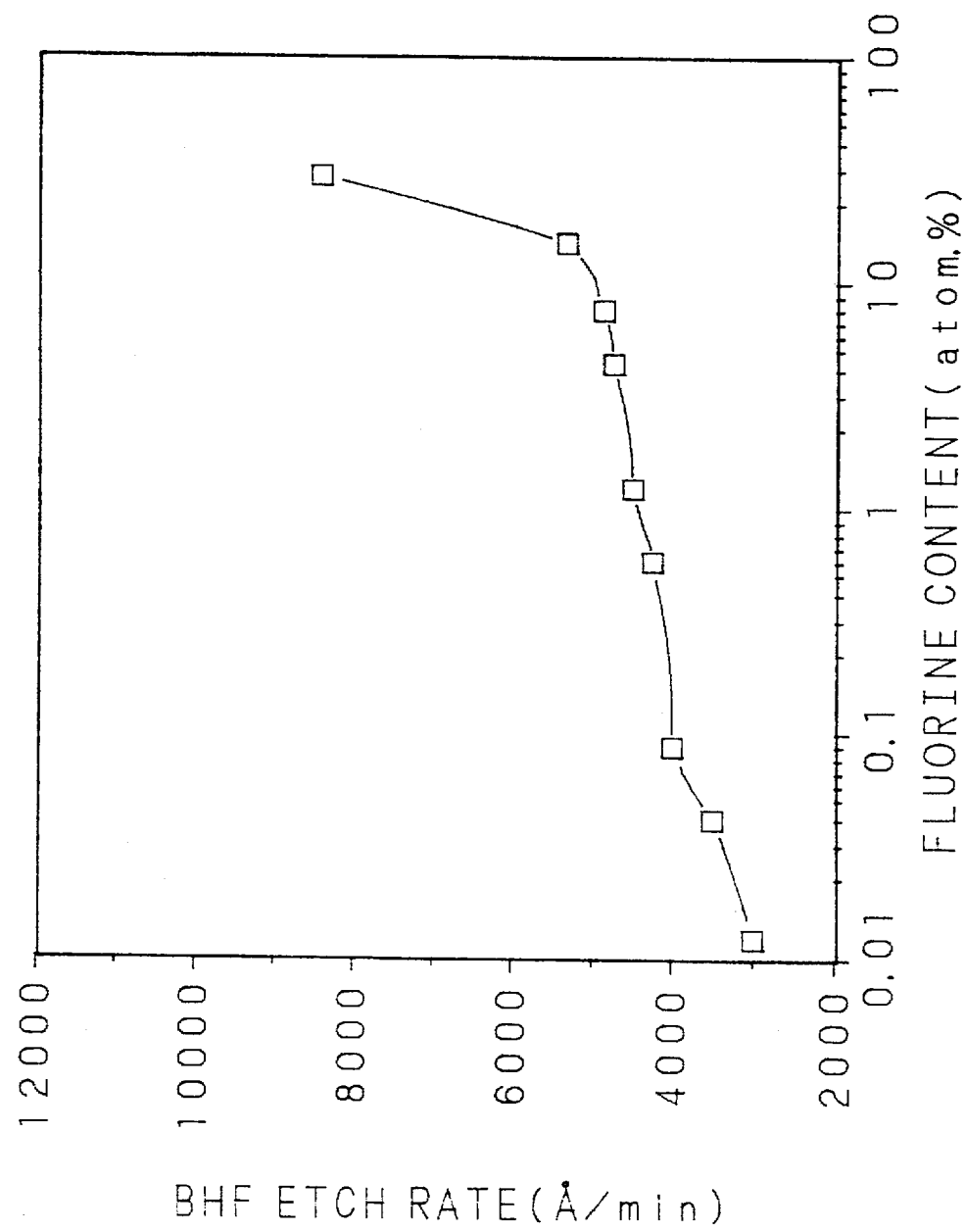
FIG. 7 is a graph showing the buffered hydrofluoric acid solution etch rate with respect to the quantity of fluorine in an Si oxide film according to the second embodiment.

FIG. 7 is a graph showing the buffered hydrofluoric acid solution etch rate with respect to the quantity of fluorine in the above-described Si oxide film. In the graph, the axis of ordinate indicates the BHF etch rate, and the axis of abscissa indicates the fluorine content. As the fluorine content changes from 0.01 atom.% to 20 atom.%, the BHF etch rate increases to 3,000 Å/min. to 4,800 Å/min. The BHF etch rate of an Si oxide film having a fluorine content of greater than 20 atom.% is larger than 8,000 Å/min. A fast etch rate indicates that the Si oxide film is porous and the reliability as an insulating film is extremely lowered. From the above, it is difficult to use an Si oxide film having a fluorine content of less than 0.1 atom.% and that having a fluorine content of greater than 20 atom.%, as an interlayer dielectric film or a passivation film.

A third embodiment of the invention will be described specifically. In the embodiment described below, an Si oxide film is formed on a specimen S by an ECR plasma CVD system. The system is constructed in the same manner as that of FIG. 1, except that $SiF_4$ and $SiH_4$ are selectively introduced from the gas feeding system 7. The corresponding portions are designated by the same reference numerals, and their description is omitted. When an Si oxide film is to be formed on the specimen S by the system, at first Ar and $O_2$ gasses are supplied from the gas feeding system 6 into the plasma chamber 1, and $SiH_4$ gas is supplied from the gas feeding system 7 into the reaction chamber 2, so that a plasma is generated to form an Si oxide film on the specimen S. When an Si oxide film of a thickness of 1,000 Å is deposited, the oscillation of the microwave is stopped and the gas supplied from the gas feeding system 7 is changed from $SiH_4$ to $SiF_4$, then, a microwave is again introduced into the plasma chamber 1.

Figure 8:
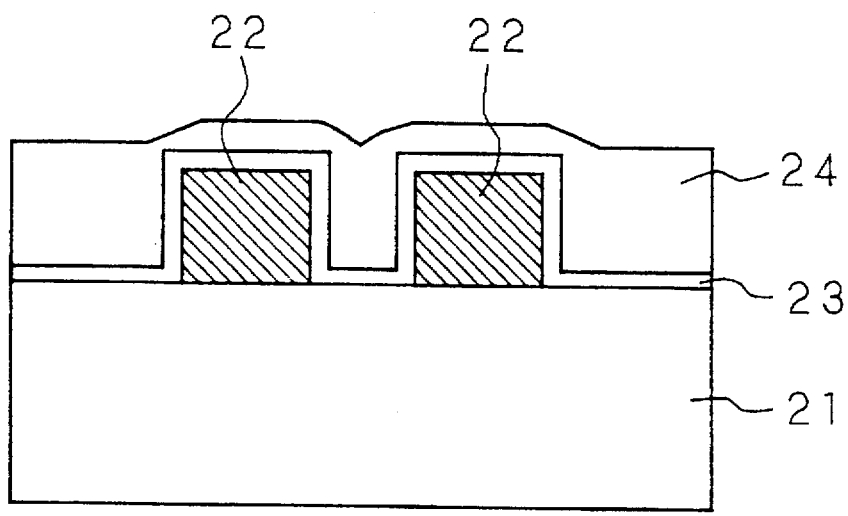
FIG. 8 is a schematic section view of an Si oxide film according to a third embodiment.

FIG. 8 is a schematic section view of an Si oxide film formed in the embodiment. A first Si oxide film 23 of a thickness of 1,000 Å is deposited on the surface of the specimen S where Al lines 22, 22 are formed on a substrate 21. The first Si oxide film 23 is produced by the use of $SiH_4$ and does not contain fluorine. A second Si oxide film 24 is deposited on the Si oxide film 23 so as to make the surface substantially flat. The second Si oxide film 24 is produced by the use of $SiF_4$ and contains fluorine. Al, which is used as a line material in the embodiment, reacts with fluorine to form an insulator, $AlF_3$. Therefore, it is not desirable to make $SiF_4$ gas contact with the specimen S on which the Al lines 22, 22 are formed. In the embodiment, since the non-fluorine Si oxide film 23 due to $SiH_4$ is thinly deposited on the Al lines 22, 22 an Si oxide film 24 due to $SiF_4$ can be formed without causing the Al lines 22, 22 and $SiF_4$ to react with each other. It is all right that the Al lines 22, 22 may be composed of an Al alloy.

A fourth embodiment of the invention will be described specifically with reference to the drawings illustrating the embodiment.

Figure 9:
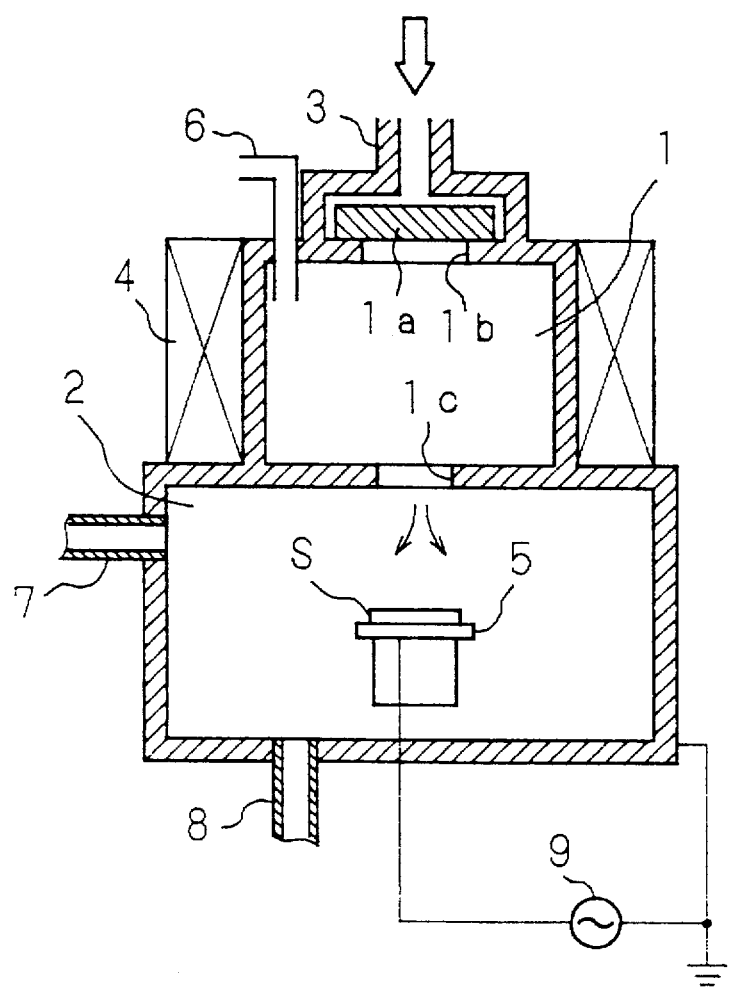
FIG. 9 is a schematic longitudinal section view showing the configuration of an ECR plasma CVD system which is used in a fourth embodiment.

FIG. 9 is a schematic longitudinal section view showing the configuration of an ECR plasma CVD system which is used in the execution of the production according to the fourth embodiment. In the figure, numeral 1 designates a plasma chamber, and 2 designates a reaction chamber. The system is constructed in the same manner as that of FIG. 1, except that the wafer stage 5 which is disposed in the reaction chamber 2 and on which the specimen S is mounted is connected to a high-frequency power source 9, thereby applying a bias voltage to the specimen S. The corresponding portions are designated by the same reference numerals, and their description is omitted.

Figure 10:
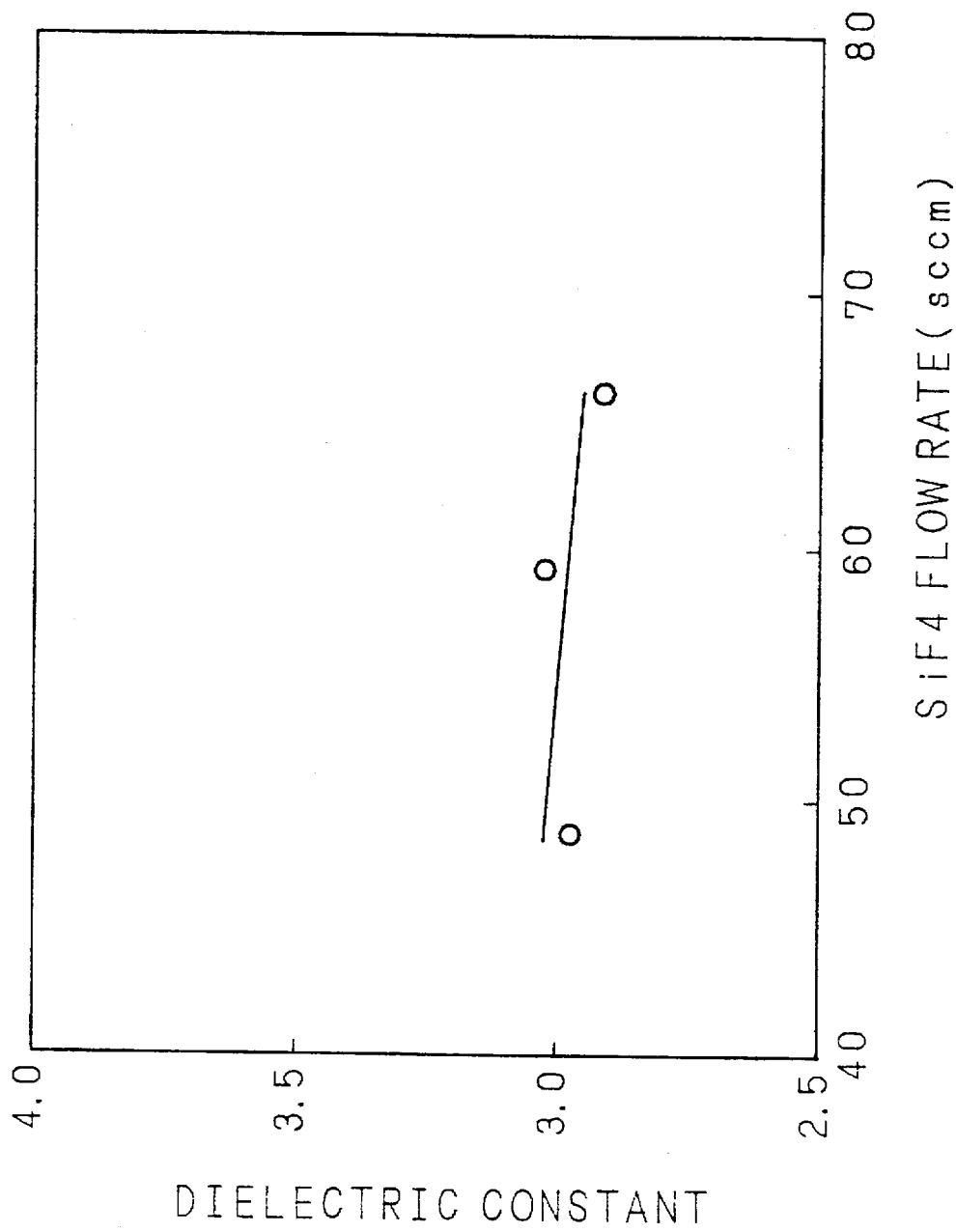
FIG. 10 is a graph showing the $SiF_4$ flow rate dependence of the dielectric constant of an Si oxide film according to the fourth embodiment.
Figure 11:
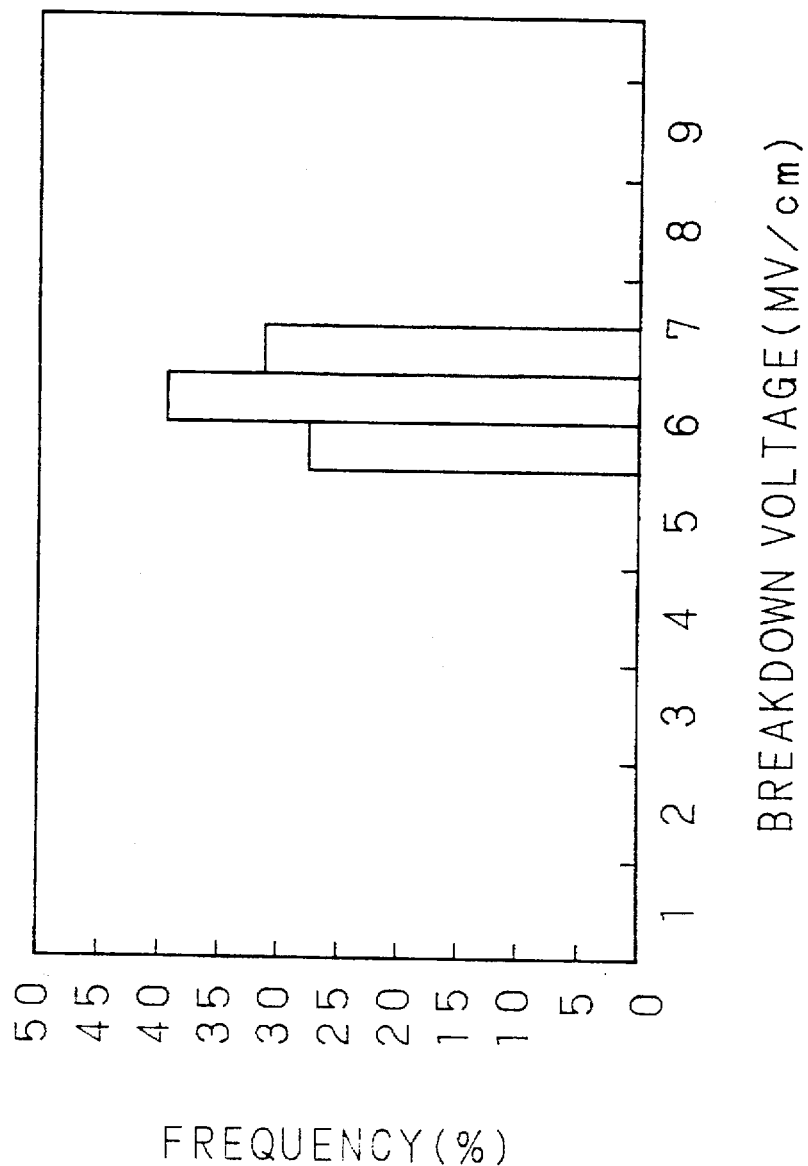
FIG. 11 is a graph showing the breakdown strength of an Si oxide film according to the fourth embodiment.

FIG. 10 is a graph showing the $SiF_4$ flow rate dependence of the dielectric constant of an Si oxide film produced by the system. In the graph, the axis of ordinate indicates the dielectric constant, arid the axis of abscissa indicates the $SiF_4$ flow rate. The film growth is conducted under the conditions that the flow rates of Ar and $O_2$ are 43 sccm and 70 sccm, respectively, the pressure is $2\times10^{-3}$ Torr, the microwave power is 2.8 kW, the high-frequency electric power is 400 W, arid the substrate temperature is 300° C. As seen from the graph, an Si oxide film having a very low dielectric constant of 2.9 to 3.0 can be obtained. FIG. 11 is a graph showing the breakdown strength of the Si oxide film. In the graph, the axis of ordinate indicates the frequency, and the axis of abscissa indicates the breakdown voltage. As seen from the graph, the breakdown voltage is distributed in the range of about 6.0 to 7.5 MV/cm. Namely, it can be said that the Si oxide film has an excellent breakdown strength in the same manner as a conventional Si oxide film.

Next, a method in which an Si oxide film is formed as an interlayer dielectric film on the specimen S having Al lines thereon by the system of FIG. 9 will be described. At first, Ar and $O_2$ gasses are supplied from the gas feeding system 6 into the plasma chamber 1, and $SiH_4$ gas is supplied from the gas feeding system 7 into the reaction chamber 2, so that a plasma is generated to form the above-mentioned Si oxide film of 1,000 Å thickness which does not contain fluorine on the specimen S. Thereafter, the oscillation of the microwave is stopped, and the gas supplied from the gas feeding system 7 is changed from $SiH_4$ to $SiF_4$. Then, a microwave is again introduced into the plasma chamber 1, and an Si oxide film containing fluorine is deposited. In this method, the high-frequency power source 9 applies a negative bias voltage to the specimen S. This enables a sputter etching to be conducted on the specimen S simultaneously with the film growth.

Figure 12A:
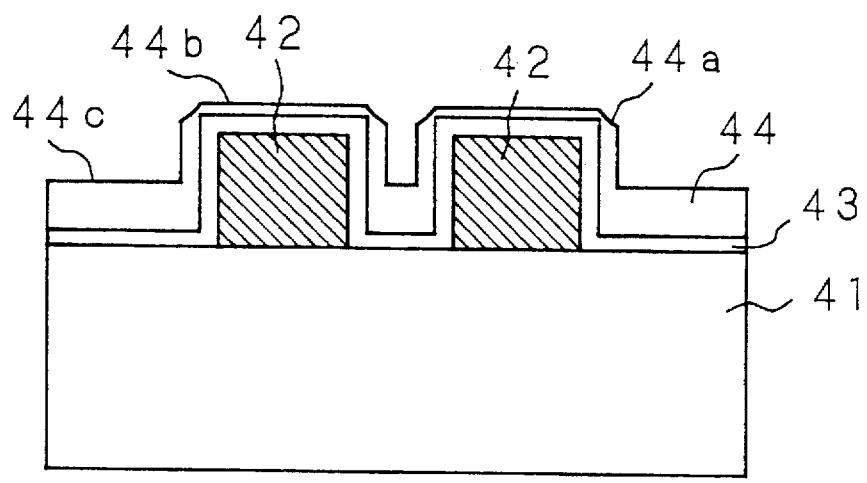
FIGS. 12(a) and 12(b) are schematic section views of an Si oxide film according to the fourth embodiment.
Figure 12B:
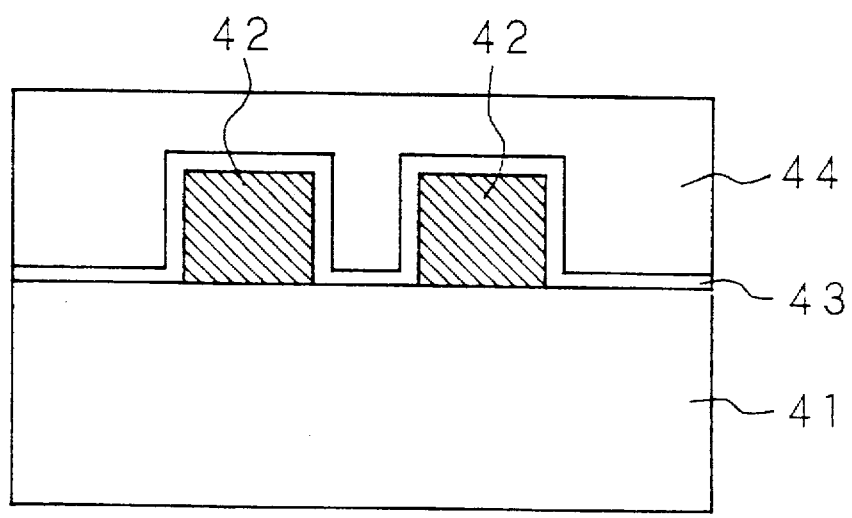
Figure 13:
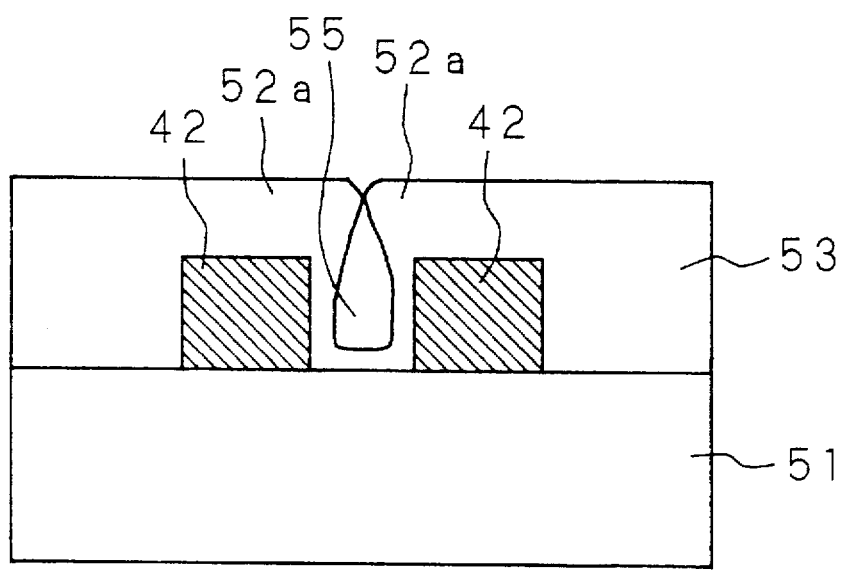
FIG. 13 is a schematic section view of an Si oxide film of a prior art example.

FIGS. 12(a) and 12(b) are schematic section views of an Si oxide film formed in the embodiment, and FIG. 13 is a schematic section view of a conventional Si oxide film. As shown in FIG. 12(a), a non-fluorine Si oxide film 43 due to $SiH_4$ and having a thickness of 1,000 Å is formed on the surface of the specimen S where Al lines 42, 42 are formed on a semiconductor substrate 41, and an Si oxide film 44 due to $SiF_4$ is deposited on the Si oxide film 43. In the sputter etching, since the etching efficiency of the edge portions 44a of the Si oxide film 44 due to $SiF_4$ is greater than that of the flat portion 44b, the edge portions 44a are partially removed away to form a taper shape. The etching efficiency of the flat portion 44c is smaller than that of the flat portion 44b. As the deposition of the Si oxide film 44 proceeds, therefore, the film growth rate of the flat portion 44c becomes substantially greater. Accordingly, as shown in FIG. 12(b), the Si oxide film 44 due to $SiF_4$ is deposited with an excellent planarity. The taper shape of the edge portions 44a allows the Si oxide film 44 to easily enter the space between the Al lines 42, 42 whereby a defect such as a void is prevented from occurring. The Al lines 22, 22 may be composed of an Al alloy.

FIG. 13 shows a conventional example in which an Si oxide film is formed on a specimen by a conventional CVD with the use of $SiH_4$. An Si oxide film 53 due to $SiH_4$ is deposited on the surfaces of Al lines 42, 42 formed on a semiconductor substrate 51. As the film growth proceeds, the edge portions 52a, 52a deposited on the Al lines 42, 42 become contacted with each other at their upper portions, and the Si oxide film 53 is made difficult to enter the space between the Al lines 42, 42. When the film growth further proceeds, the upper portion of the space between the Al lines 42, 42 is covered by the edge portions 52a, 52a to form a void 55. As described above, according to the embodiment, a semiconductor device having an Si oxide film of the improved planarizability can be produced.

A fifth embodiment of the invention will be described specifically with reference to the drawings illustrating the embodiment.

Figure 14:
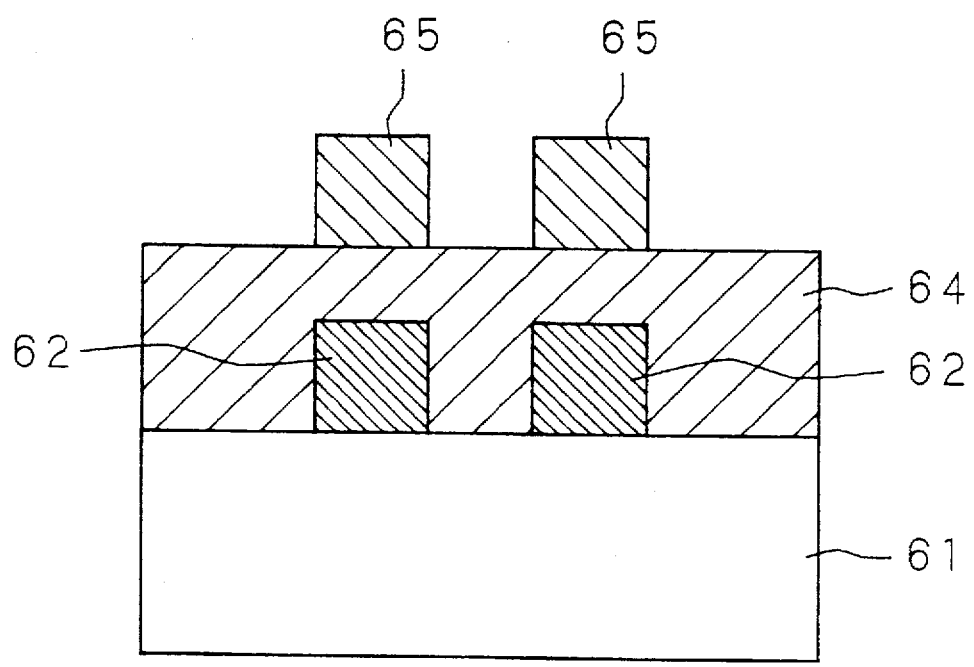
FIG. 14 is a schematic section view of a semiconductor device produced by a method of a fifth embodiment.

FIG. 14 is a schematic section view of a semiconductor device which is produced by a method of a fifth embodiment. In the system of FIG. 9, Ar and $O_2$ gasses are supplied from the gas feeding system 6 into the plasma chamber 1, and $SiF_4$ gas is supplied from the gas feeding system 7 into the reaction chamber 2, so that a plasma is generated. Under this state, the high-frequency power source 9 applies a negative bias voltage to the specimen S, whereby an Si oxide film 64 is deposited on the specimen S where Al lines 62, 62 are formed on a semiconductor substrate 61. Then, Al lines 65, 65 are formed on the Si oxide film 64.

As described above, an Si oxide film which is formed with the use of $SiF_4$ has a dielectric constant of 2.9 to 3.7. Therefore, the mutual interference noise between the Al lines 62, 62 and the Al lines 65, 65 is lowered in level, and the signal delay characteristic of the Al lines 62, 62 and the Al lines 65, 65 is improved.

When the capacity between lines is set to be constant, a layer insulating Si oxide film having a dielectric constant of about 3.0 and formed according to the embodiment can be made smaller in thickness than that having a dielectric constant of about 4.0 and formed according to the prior art. In the case where a film thickness of 1 µm is required in the prior art, for example, the same capacity between lines can be achieved by forming an Si oxide film containing fluorine in a thickness of 0.75 µm according to the invention. In this way, the use of an Si oxide film containing fluorine according to the invention allows the film thickness to be reduced while maintaining the capacity between lines at the same level. This can reduce the aspect ratio of a via hole, which becomes large as the progress of the fine patterning technology.

Figure 15:
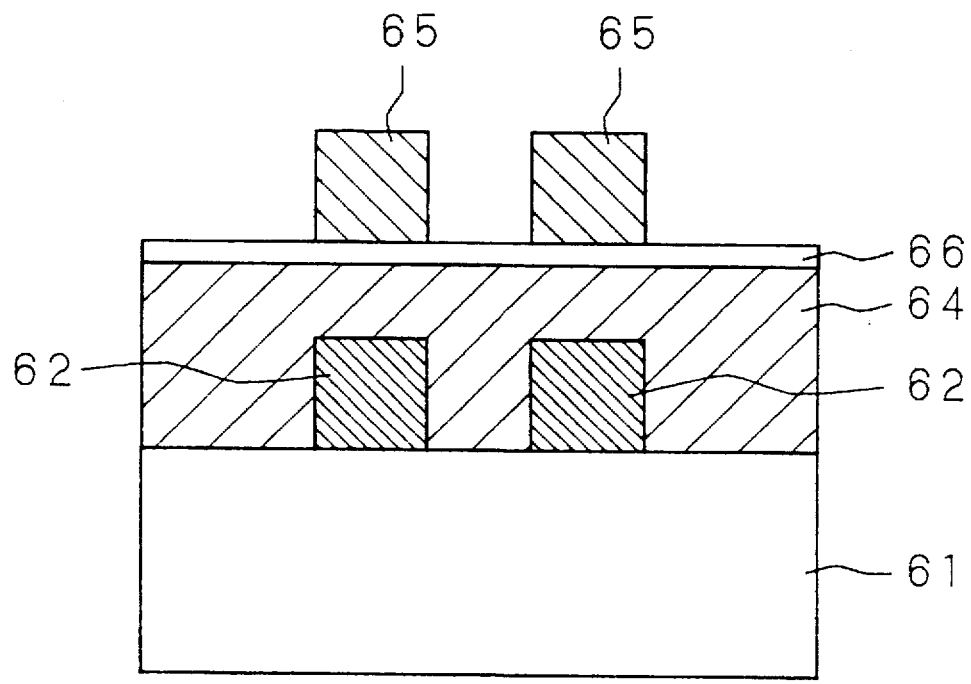
FIG. 15 is a schematic section view of another semiconductor device produced by the method of the fifth embodiment.

FIG. 15 is a schematic section view of another semiconductor device produced by the method of the fifth embodiment. In the system of FIG. 9, Ar and $O_2$ gasses are supplied from the gas feeding system 6 into the plasma chamber 1, and $SiF_4$ gas is supplied from the gas feeding system 7 into the reaction chamber 2, so that a plasma is generated. Under this state, the high-frequency power source 9 applies a negative bias voltage to the specimen S, whereby the Si oxide film 64 is deposited on the specimen S where the Al lines 62, 62 are formed on the semiconductor substrate 61. Thereafter, the oscillation of the microwave is stopped, arid the gas supplied from the gas feeding system 7 is changed from $SiF_4$ to $SiH_4$. Then, a microwave is again introduced into the plasma chamber 1, and the above-mentioned non-fluorine Si oxide film 66 of 300 Å thickness is deposited. Thereafter, the Al lines 65, 65 are formed on the non-fluorine Si oxide film 66.

According to the method, during the formation of the Al lines 65, 65, the degree of the contact between the Al lines 65, 65 and a silicon compound gas containing fluorine, and that of the contact between the Al lines 65, 65 and fluorine can be reduced so that the change of the crystal grain size and the corrosion of the Al lines 65, 65 which may be caused by the contact are prevented from occurring. Since the non-fluorine Si oxide film 66 can be formed in a reduced thickness, it does not affect the space between the lines, and therefore the mutual interference noise level is lowered and the signal delay characteristic is improved as compared with those of the prior art.

In the aforementioned production method, immediately after the completion of the formation of the Si oxide film 64 which functions as an interlayer dielectric film, the high-frequency electric power may be increased in level so that the sputtering yield of the surface is raised, thereby decreasing the number of fluorine atoms in the surface. Alternatively, immediately after the completion of the formation of the Si oxide film 64, a high-frequency bias voltage may be applied to the substrate while irradiating the substrate with a plasma of a nonreactive gas such as Ar gas, so that the sputtering is positively conducted, thereby decreasing the number of fluorine atoms in the surface. According to the alternatives, the prevention of the change in the crystal grain size and the corrosion of the Al lines 65, 65 can be further enhanced.

Figure 16:
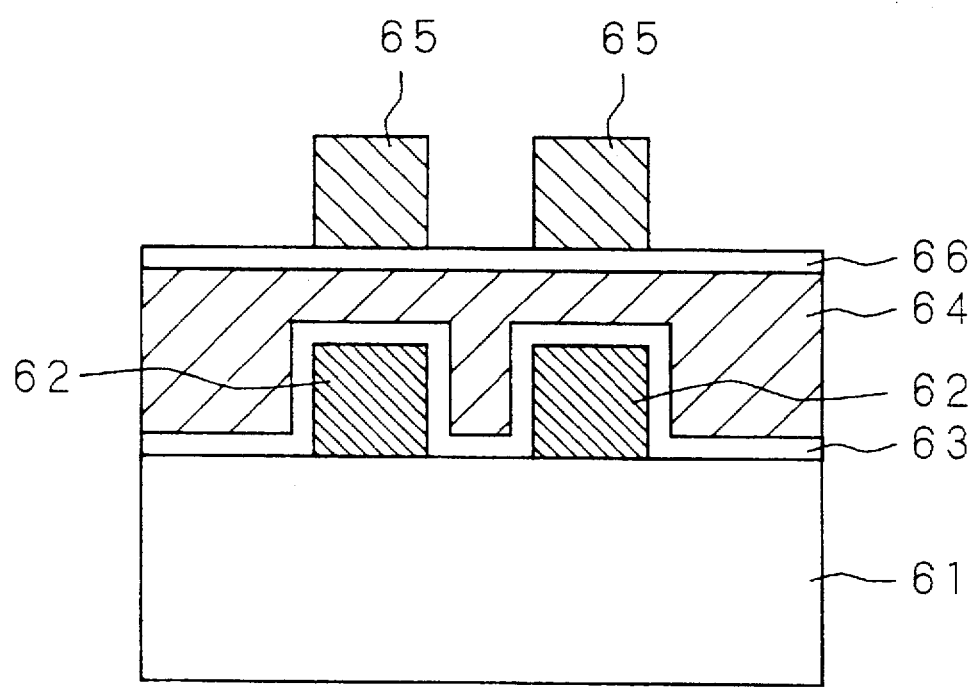
FIG. 16 is a schematic section view of a further semiconductor device produced by the method of the fifth embodiment.

FIG. 16 is a schematic section view of a further semiconductor device produced by the method of the fifth embodiment. In the system of FIG. 9, a non-fluorine Si oxide film 63 is at first formed by a plasma CVD using $SiH_4$ on the specimen S where the Al lines 62, 62 are formed on the semiconductor substrate 61. Then, $SiF_4$ gas is supplied from the gas feeding system 7 into the reaction chamber 2, so that a plasma is generated. Under this state, the high-frequency power source 9 applies a negative bias voltage to the specimen S, whereby the second Si oxide film 64 containing fluorine is formed on the specimen S where the Al lines 62, 62 are formed on the semiconductor substrate 61. Thereafter, the oscillation of the microwave is stopped, and the gas supplied from the gas feeding system 7 is changed from $SiF_4$ to $SiH_4$. Then, a microwave is again introduced into the plasma chamber 1, and the third Si oxide film 66 of 300 Å thickness which does not contain fluorine is deposited. Thereafter, the Al lines 65, 65 are formed on the non-fluorine Si oxide film 66. In the semiconductor device produced in this manner, the prevention of the corrosion of the Al lines 62, 62 and 65, 65 which is due to fluorine can be further enhanced.

A sixth embodiment of the invention will be described specifically with reference to the drawings illustrating the embodiment.

Figure 17:
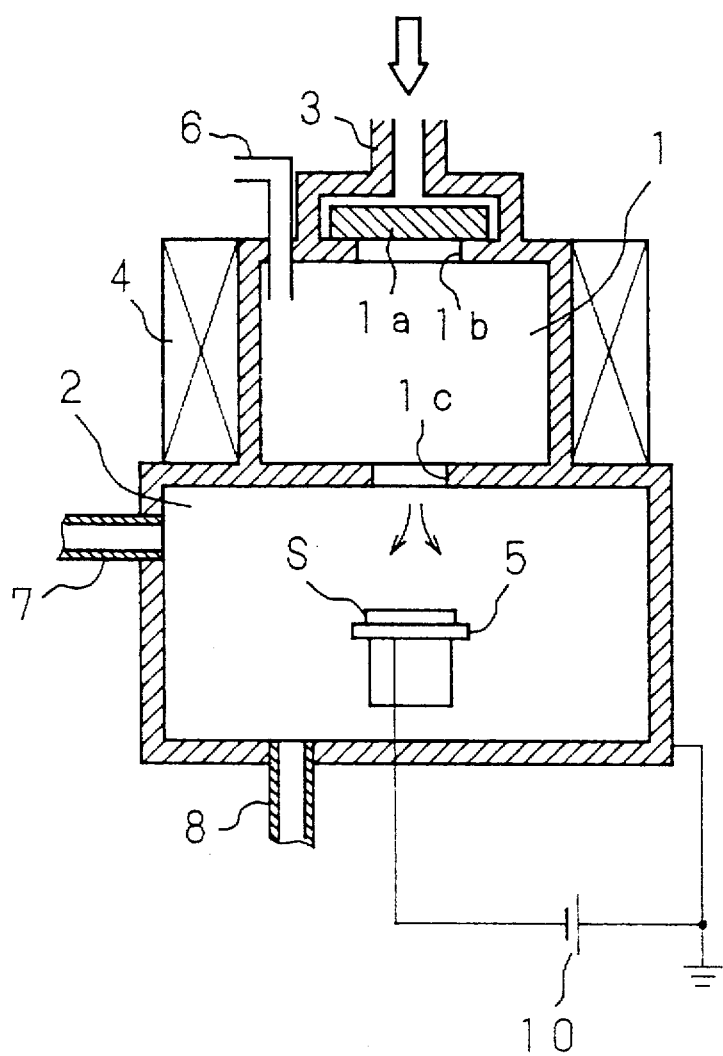
FIG. 17 is a schematic longitudinal section view showing the configuration of an ECR plasma CVD apparatus which is used in a sixth embodiment.

FIG. 17 is a schematic longitudinal section view showing the configuration of an ECR plasma CVD system which is used in the execution of the production according to the sixth embodiment. In the figure, 1 designates a plasma chamber, and 2 designates a reaction chamber. The system is constructed in the same manner as that of FIG. 9, except that the specimen table 5 which is disposed in the reaction chamber 2 and on which the specimen S is mounted is connected to a DC power source 10, thereby applying a negative DC electric field to the specimen S, and that $O_2$ and $N_2$ are concurrently or selectively introduced from the gas feeding system 6 and $SiF_4$ and $SiH_4$ are concurrently or selectively introduced from the gas feeding system 7. The corresponding portions are designated by the same reference numerals, and their description is omitted.

Figure 18:
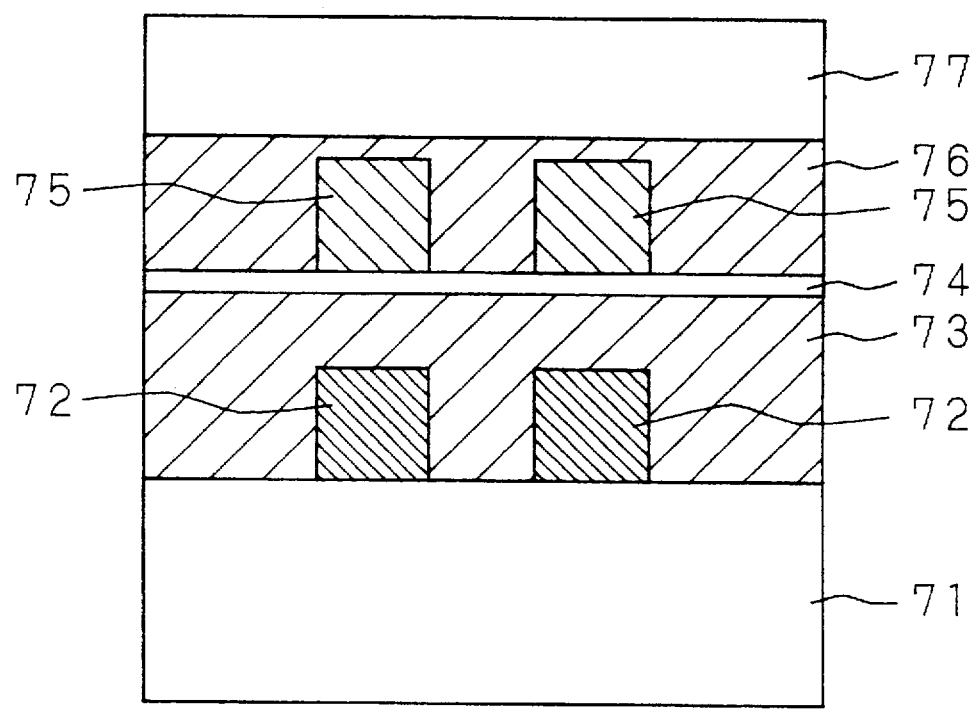
FIG. 18 is a schematic section view of a semiconductor device produced by a method of the sixth embodiment.

FIG. 18 is a schematic section view of a semiconductor device produced by a method of the sixth embodiment. In the system described above, $SiF_4$ gas is introduced from the gas feeding system 7 into the reaction chamber 2 so that a plasma is generated, and a negative bias voltage is applied to the specimen S, whereby an Si oxide film 73 is formed on the specimen S where Al lines 72, 72 are formed on a semiconductor substrate 71. Thereafter, the oscillation of the microwave is stopped, and the gas introduced from the gas feeding system 7 is changed from $SiF_4$ to $SiH_4$. Then, a microwave is again introduced into the plasma chamber 1, and the above-mentioned non-fluorine Si oxide film 74 of 300 Å thickness is deposited. After uppermost Al lines 75, 75 are formed on the non-fluorine Si oxide film 74, $SiF_4$ gas is again introduced to generate a plasma, and a negative bias voltage is applied to the specimen S, whereby an Si oxide film 76 is deposited so as to bury the space between the Al lines 75, 75 to flatten the surface. Thereafter, an Si nitride film 77 which functions as a passivation film is formed with the use of $SiH_4$ and $N_2$ gasses. In the formation of the Si nitride film 77, $SiF_4$ gas may be used in place of $SiH_4$ gas. Alternatively, in place of $N_2$ gas, $N_2$ and $O_2$ or $N_2$ and $N_2O$ may be introduced so that the Si nitride film 77 is formed as an Si oxide and nitride film. The formation of the Si oxide and nitride film results in the formation of a passivation film of a further reduced stress.

In this way, an Si oxide film of a low dielectric constant is formed in the space between the uppermost Al lines 75, 75 and an Si nitride film is formed thereon. In the prior art, the uppermost Al lines 75, 75 are covered by an Si nitride film which functions as a passivation film, resulting in that an Si nitride film of a high dielectric constant (=6.9) exists between the Al lines 75, 75. The formation of the Si nitride film having a low dielectric constant in the embodiment can reduce the level of the mutual interference noise between the Al lines 75, 75 and improve the signal delay characteristic. According to the invention, an Si oxide film of excellent characteristics can be formed and particles can be prevented from being produced.

Figure 19:
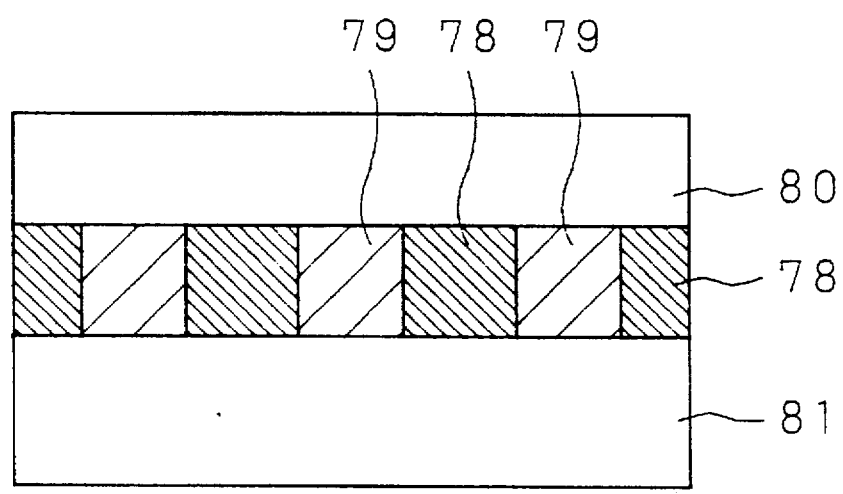
FIG. 19 is a schematic section view of a semiconductor device produced by a method of a seventh embodiment.

FIG. 19 is a schematic section view of a semiconductor device produced by a method of a seventh embodiment. In the system of FIG. 9, Ar and $O_2$ gasses are supplied from the gas feeding system 6 into the plasma chamber 1, and $SiF_4$ gas is supplied from the gas feeding system 7 into the reaction chamber 2, so that a plasma is generated. Under this state, the high-frequency power source 9 applies a negative bias voltage to the specimen S, whereby an Si oxide film 79 is formed on the specimen S where Al lines 78, 78 are formed on an insulating film 81 which does not contain fluorine. At the time when the surface of the Si oxide film 79 becomes flush with the surfaces of the Al lines 78, 78, the oscillation of the microwave is stopped, and the supplied gas is changed from $SiF_4$ to $SiH_4$. Then, a microwave is again introduced into the plasma chamber 1, and a non-fluorine Si oxide film 80 is deposited on the Al lines 78, 78 and the Si oxide film 79.

In this way, the Si oxide film 79 containing fluorine is formed only in the space between the Al lines 78, 78, whereby the increase of the capacity between wirings in the same layer can be suppressed. This allows a semiconductor device which can be produced at the same cost as that of the prior art and can operate at a higher speed, to be formed by using the Si oxide film 79 containing fluorine only in the space between the lines relating to a high speed operation of the semiconductor device, and using a conventional Si oxide film which does not contain fluorine in the other portion.

In the embodiment, insulating films which do not contain fluorine are used for the insulating film 81 and the Si oxide film 80 respectively formed below and above the Al lines 78, 78 . . . . The insulating films may be conventional Si oxide films which are deposited by a plasma CVD with the use of SiH$_4$, TEOS, or the like. In the case where the layer in which the Al lines 78 are formed is the uppermost line layer, a passivation film such as an Si nitride is formed on the Al lines 78, 78 . . . and the Si oxide film 79.

In the embodiment, Al lines are used. The material of the lines is not restricted to this, and may be selected from other metals including W, Cu, Ag, Au and TiN.

The embodiment in which SiF$_4$ and O$_2$ are supplied has been described. The invention is not restricted to this. Alternatively, a silicon compound gas containing fluorine, and O$_2$ or N$_2$O may be used.

In the embodiment, the Al lines 22, 22 may be Al alloy lines, or W lines or Cu lines.

In the embodiment, an ECR plasma CVD is employed as a plasma CVD. The invention is not restricted to this, and a microwave plasma CVD or an RF plasma CVD may be employed.

As described above, according to this invention, an Si oxide film is formed by a plasma CVD with the use of a silicon compound gas containing fluorine, and therefore the invention can achieve excellent effects such as that the generation of particles can be suppressed and therefore the quality of the produced device and the yield thereof are improved, that the planarizability of the Si oxide film can be improved, and that the signal transmission in a semiconductor device can be conducted at a high speed.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A method for forming a laminated film comprising a silicon oxide which contains fluorine and a silicon oxide which does not contain fluorine on a silicon substrate by a plasma CVD method using an ECR plasma system, comprising the steps of:

(a) setting a substrate on a stage in a vacuum chamber or of an ECR plasma system;

(b) exhausting a gas in said vacuum chamber to reduce the gas pressure;

(c) supplying an O$_2$ gas and/or an N$_2$O gas into said vacuum chamber;

(d) generating an ECR plasma by applying a microwave of determined frequency and applying a determined magnetic flux density;

(e) forming Al lines or Al alloy lines;

(f) depositing a first silicon oxide film which does not contain fluorine on a surface of said lines by supplying a silicon compound gas into said vacuum chamber;

(g) depositing a second silicon oxide film which contains fluorine on said first silicon oxide film by supplying a silicon fluoride gas into said vacuum chamber.

2. A method of claim 1, wherein said first silicon oxide film and/or said second silicon oxide film is deposited by applying a negative voltage to the substrate.

3. A method of claim 1, wherein said first silicon oxide film and/or said second silicon oxide film is deposited by applying a high-frequency voltage to the substrate.

* * * * *